(12) United States Patent
Tsuchiya et al.

(10) Patent No.: US 12,191,138 B2
(45) Date of Patent: Jan. 7, 2025

(54) PROCESSING METHOD OF WORKPIECE

(71) Applicant: DISCO CORPORATION, Tokyo (JP)

(72) Inventors: Toshio Tsuchiya, Tokyo (JP);
Toshiyuki Yoshikawa, Tokyo (JP);
Tomoyuki Hongo, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 581 days.

(21) Appl. No.: 17/447,847

(22) Filed: Sep. 16, 2021

(65) Prior Publication Data

US 2022/0108882 A1    Apr. 7, 2022

(30) Foreign Application Priority Data

Oct. 2, 2020  (JP) ................................. 2020-167468

(51) Int. Cl.
| | | |
|---|---|---|
| H01L 21/02 | (2006.01) | |
| B23K 26/50 | (2014.01) | |
| G02B 26/10 | (2006.01) | |
| H01L 21/268 | (2006.01) | |
| H01L 21/683 | (2006.01) | |

(52) U.S. Cl.
CPC ........ H01L 21/02035 (2013.01); B23K 26/50 (2015.10); G02B 26/105 (2013.01); H01L 21/268 (2013.01); H01L 21/6836 (2013.01)

(58) Field of Classification Search
None
See application file for complete search history.

(56) References Cited

U.S. PATENT DOCUMENTS

2017/0301571 A1* 10/2017 Tsuchiya ............. H01L 21/6836
2019/0275609 A1    9/2019 Chen et al.

FOREIGN PATENT DOCUMENTS

| JP | 53072451 A | 6/1978 |
|---|---|---|
| JP | 08057669 A | 3/1996 |
| JP | 2003273053 A | 9/2003 |
| JP | 2004111606 A | 4/2004 |
| JP | 2004319885 A | 11/2004 |
| JP | 2005353935 A | 12/2005 |

(Continued)

OTHER PUBLICATIONS

Yuichi et al, JP2004111606A, Method of Processing Wafer Apr. 8, 2004 (Year: 2004).*

(Continued)

*Primary Examiner* — Alexander G Ghyka
(74) *Attorney, Agent, or Firm* — Greer, Burns & Crain, Ltd.

(57) ABSTRACT

A processing method of a workpiece with a circular disc shape includes sticking a tape to one surface of the workpiece and integrating the workpiece and a frame through the tape, holding the workpiece by a holding unit with the interposition of the tape, and irradiating the other surface of the workpiece located on the opposite side to the one surface with a pulsed laser beam having such a wavelength as to be absorbed by the workpiece from the side of the other surface. In irradiating the laser beam, the other surface is annularly irradiated with the laser beam in the state in which the orientation of the laser beam is adjusted in such a manner that the laser beam has an angle of incidence formed due to inclination with respect to a normal to the other surface of the workpiece by a predetermined angle.

10 Claims, 16 Drawing Sheets

(56) References Cited

FOREIGN PATENT DOCUMENTS

| JP | 2006108532 A | 4/2006 |
|----|--------------|--------|
| JP | 2016002585 A | 1/2016 |
| JP | 2017195219 A | 10/2017 |
| JP | 2018012132 A | 1/2018 |

OTHER PUBLICATIONS

Taira et al, JP 2006049870A, Method and Apparatus for Processing Outer Periphery of Substrate, Feb. 16, 2006 (Year: 2006).*
JP 2005353935A, Toshiyuki et al, Wafer Processing Method, Dec. 22, 2005 (Year: 2005).*
JP 2008130818A, Masanori et al, Laser Processing Apparatus, Jun. 5, 2008 (Year: 2008).*
Search report issued in counterpart Singapore patent application No. 10202110108V, dated Sep. 21, 2022.
Japanese corresponding Patent Application JP 2020-167468: English translation of Notice of Reasons for Refusal, dated Jul. 9, 2024 (3 pages).

* cited by examiner

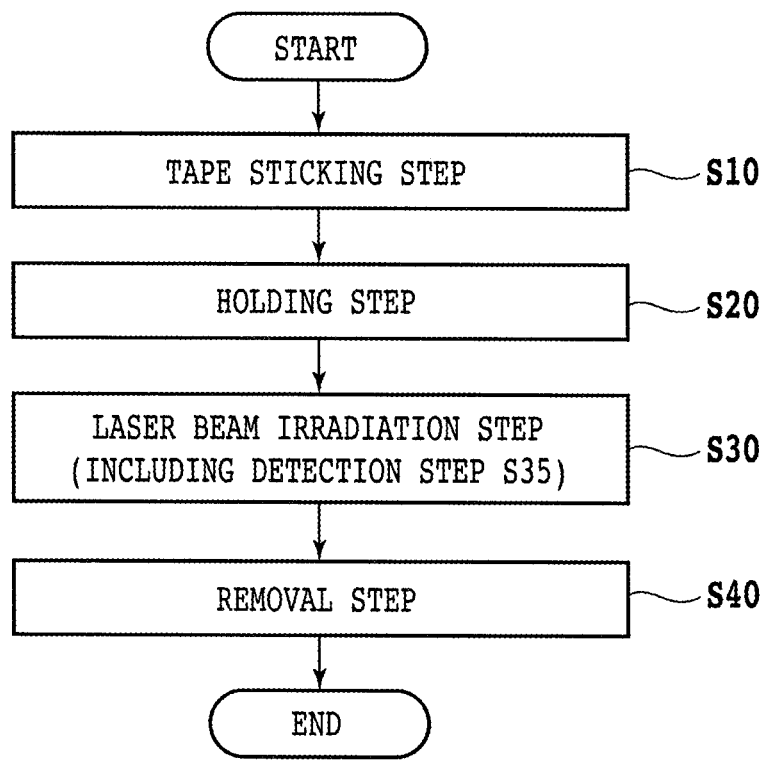

PROCESSING METHOD OF WORKPIECE

BACKGROUND OF THE INVENTION

Field of the Invention

The present invention relates to a processing method of a workpiece in which the workpiece with a circular disc shape is processed by a pulsed laser beam having such a wavelength as to be absorbed by the workpiece.

Description of the Related Art

Along with reduction in a size and a weight of electronic equipment in recent years, reduction in a thickness of device chips has been advancing. To manufacture thin device chips, for example, a back surface side of a workpiece such as a semiconductor wafer in which devices such as integrated circuits (ICs) and large scale integration (LSI) are formed on a front surface side is ground to have a thickness of 20 μm to 100 μm (for example, refer to Japanese Patent Laid-open No. 2004-319885) and thereafter the workpiece is divided into the individual device chips. However, the outer circumferential part of the front surface side and the back surface side of the workpiece is normally beveled (that is, bevel part is formed). Therefore, when the back surface side of the workpiece is ground to cause the thickness of the workpiece to become half or less, generally-called a knife edge (also referred to as sharp edge) is formed at the outer circumferential part of the workpiece. When the knife edge is formed, there is a problem that breakage or chipping occurs at the outer circumferential part of the workpiece in grinding of the workpiece or in conveyance thereof.

In order to solve this problem, a process in which the outer circumferential part at which a beveled part is formed is removed by a cutting apparatus has been proposed (for example, refer to Japanese Patent Laid-open No. 2003-273053). Specifically, the front surface side of a workpiece is held by a chuck table and the chuck table is rotated in a state in which the lower end part of a cutting blade set at a position separate inward from the outer circumferential end part of the workpiece by a predetermined distance is made to cut into the back surface side of the workpiece. However, when the workpiece is cut along a path with a curved line shape according to the outer circumference of the workpiece by the cutting blade that cuts the workpiece along a path with a straight line shape generally, the workpiece receives stress and breaks in some cases. Moreover, there is a problem that it takes a long time to cut the workpiece by the cutting blade along the path with a curved line shape and therefore the productivity is comparatively low.

Thus, a method has been proposed in which the outer circumferential part of a workpiece at which a beveled part is formed is removed by a pulsed laser beam having such a wavelength as to be absorbed by the workpiece instead of the cutting blade and thereafter grinding of the back surface side is executed (for example, refer to Japanese Patent Laid-open No. 2006-108532).

SUMMARY OF THE INVENTION

However, when a laser beam is applied to one surface of a workpiece substantially perpendicularly, there is a possibility that the state of a laser oscillator becomes unstable due to return of the laser beam reflected by the one surface to the laser oscillator and processing failure occurs. The present invention is made in view of such a problem and intends to remove a region including a beveled part of a workpiece by using a laser beam while suppressing return of the laser beam to a laser oscillator.

In accordance with an aspect of the present invention, there is provided a processing method of a workpiece with a circular disc shape. The processing method includes a tape sticking step of sticking a tape to one surface of the workpiece and integrating the workpiece and a frame through the tape, a holding step of holding the workpiece by a holding unit with the interposition of the tape after the tape sticking step, and a laser beam irradiation step of irradiating the other surface of the workpiece located on the opposite side to the one surface with a pulsed laser beam having such a wavelength as to be absorbed by the workpiece from the side of the other surface after the holding step. In the laser beam irradiation step, the other surface is annularly irradiated with the laser beam in a state in which the orientation of the laser beam is adjusted in such a manner that the laser beam has an angle of incidence formed due to inclination with respect to a normal to the other surface of the workpiece by a predetermined angle.

Preferably, the workpiece is held in a state in which the other surface is exposed to the lower side in the holding step, and irradiation with the laser beam that travels from the lower side toward the upper side is executed in the laser beam irradiation step.

Furthermore, preferably, in the laser beam irradiation step, an annular processing groove having a predetermined diameter on the side of the other side is formed inside an outer circumferential edge of the workpiece to separate the workpiece with the processing groove being a boundary.

Moreover, preferably, the workpiece has, on the side of the other surface, a device region in which a plurality of devices are formed and an outer circumferential surplus region that surrounds the device region and is a range to a position separate inward from the outer circumferential edge of the workpiece by a predetermined distance, and the workpiece has, on the side of the one surface, a circular recess part corresponding to the device region and an annular projection part that surrounds the outside of the circular recess part and corresponds to the outer circumferential surplus region. In addition, a boundary part between the device region and the outer circumferential surplus region on the side of the other surface is irradiated with the laser beam in the laser beam irradiation step.

Furthermore, preferably, the workpiece has, on the side of the other surface, a device region in which a plurality of devices are formed and an outer circumferential surplus region that surrounds the device region and is a range to a position separate inward from the outer circumferential edge of the workpiece by a predetermined distance, and the workpiece has, on the side of the one surface, a circular recess part corresponding to the device region and an annular projection part that surrounds the outside of the circular recess part and corresponds to the outer circumferential surplus region. In addition, in the laser beam irradiation step, a part corresponding to the outer circumferential surplus region in the thickness direction of the workpiece is subjected to ablation to be removed by irradiating the outer circumferential surplus region that is from the outer circumferential edge to the position separate inward from the outer circumferential edge by the predetermined distance with the laser beam.

Moreover, preferably, in the laser beam irradiation step, the other surface is irradiated with the laser beam in a state in which the plane of incidence of the laser beam is set orthogonal to a virtual plane that passes through the center of the other surface and the focal point of the laser beam and is orthogonal to the other surface.

Furthermore, preferably, a processing groove orthogonal to the other surface is formed by rotating the holding unit with respect to the focal point of the laser beam in the laser beam irradiation step.

Moreover, preferably, in the laser beam irradiation step, irradiation with the laser beam that travels obliquely with respect to the other surface from the side of the center of the other surface toward the outside of the other surface is executed in a state in which the plane of incidence of the laser beam is set parallel to a virtual plane that passes through the center of the other surface and the focal point of the laser beam and is orthogonal to the other surface.

Furthermore, preferably, in the laser beam irradiation step, the irradiation with the laser beam is executed in the state in which the plane of incidence of the laser beam is set parallel to the virtual plane by controlling the irradiation position of the laser beam by a galvanometer scanner disposed to face the other surface.

Moreover, preferably, the laser beam irradiation step forms a processing groove in the workpiece by the laser beam and includes a detection step of detecting the laser beam that has passed through the processing groove by a light detection unit when the processing groove has penetrated the workpiece.

The processing method of a workpiece according to the aspect of the present invention includes the laser beam irradiation step of irradiating the other surface of the workpiece with the pulsed laser beam having such a wavelength as to be absorbed by the workpiece. In the laser beam irradiation step, the other surface is annularly irradiated with the laser beam in the state in which the orientation of the laser beam is adjusted in such a manner that the laser beam has the angle of incidence formed due to inclination with respect to the normal to the other surface of the workpiece by the predetermined angle. In the laser beam irradiation step, because the laser beam has the angle of incidence formed due to inclination with respect to the normal to the other surface of the workpiece by the predetermined angle, even when the laser beam is reflected by the other surface, return of the laser beam to the laser oscillator can be suppressed. Therefore, the state of the laser oscillator is less liable to become unstable and thus the possibility of processing failure in the laser processing can be reduced.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIG. 1 is a flowchart of a processing method.

DETAILED DESCRIPTION OF THE PREFERRED EMBODIMENTS

Figure 2A:
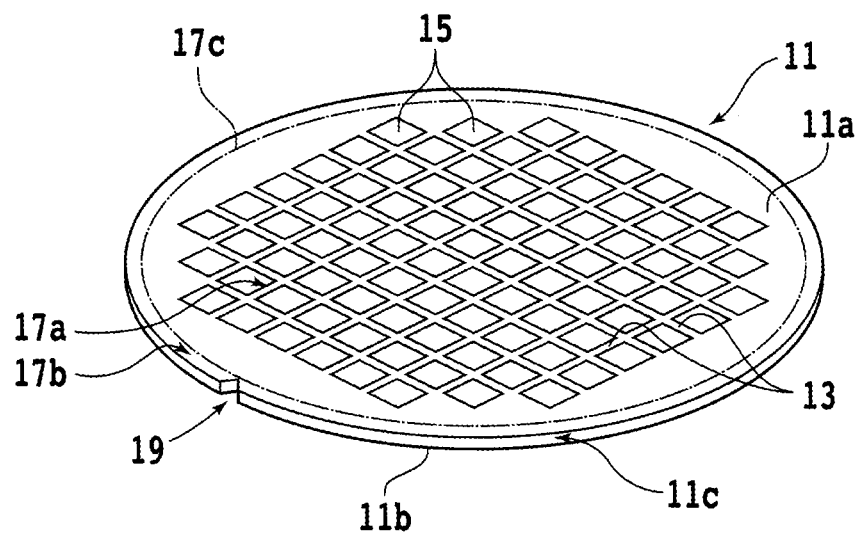
FIG. 2A is a perspective view of a front surface side of a workpiece.
Figure 2B:
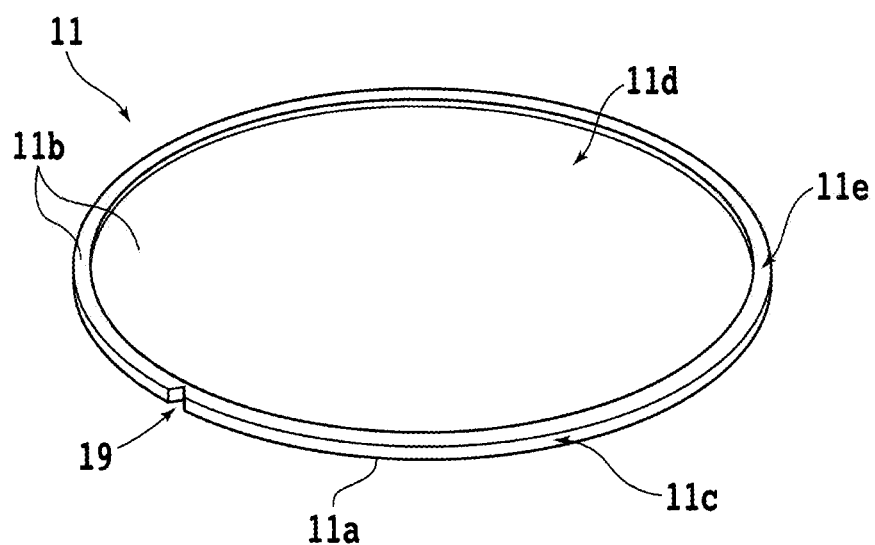
FIG. 2B is a perspective view of a back surface side of the workpiece.

Embodiments of the present invention will be described with reference to the accompanying drawings. FIG. 1 is a flowchart of a processing method according to a first embodiment. First, a workpiece 11 that is a processing target of the present embodiment and has a circular disc shape will be described. FIG. 2A is a perspective view of a side of a front surface (the other surface) 11a of the workpiece 11. FIG. 2B is a perspective view of a side of a back surface (one surface) 11b of the workpiece 11 located on the opposite side to the front surface 11a.

As illustrated in FIG. 2A, on the side of the front surface 11a of the workpiece 11, plural planned dividing lines (streets) 13 are set in a lattice manner and a device 15 such as an IC or LSI is formed in each of plural regions marked out by the plural planned dividing lines 13. The workpiece 11 of the present embodiment is a wafer made of silicon. However, there is no limit on the material, structure, size, and so forth of the workpiece 11. The workpiece 11 may be a wafer formed of another semiconductor material. Similarly, there is also no limit on the kind, quantity, shape, structure, size, and so forth of the device 15.

A circular device region 17a including the plural devices 15 exists at a central part on the side of the front surface 11a. An outer circumferential surplus region 17b in which the devices 15 are not formed and that is substantially flat compared with the device region 17a exists around the device region 17a. The outer circumferential surplus region 17b is a range to a position separate inward from an outer circumferential edge 11c of the workpiece 11 excluding a notch 19 by a predetermined distance in the front surface 11a. For example, in the case of a wafer having a diameter of 12 inches (approximately 300 mm), a range of approximately 3 mm from the outer circumferential edge 11c is the outer circumferential surplus region 17b.

Figure 3:
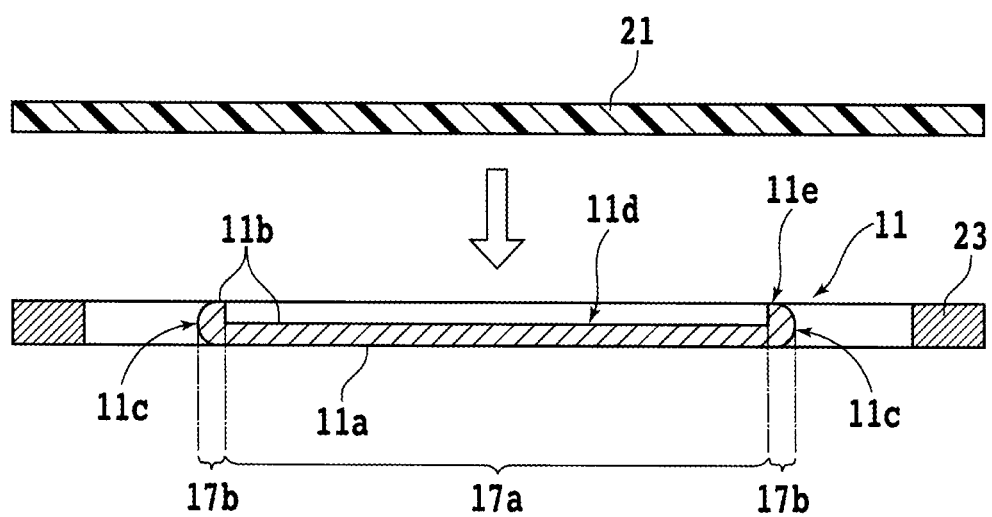
FIG. 3 is a diagram illustrating a tape sticking step.

In FIG. 2A, a boundary part 17c between the device region 17a and the outer circumferential surplus region 17b is depicted by a one-dot chain line. As illustrated in FIG. 2B, in the workpiece 11 of the present embodiment, a circular recess part 11d formed by thinning of the side of the back surface 11b by a predetermined thickness exists at a central part on the side of the back surface 11b. The circular recess part 11d is a region corresponding to the device region 17a in the thickness direction of the workpiece 11. Outside the circular recess part 11d, an annular projection part 11e is formed to surround the circular recess part 11d. The annular projection part 11e is a region corresponding to the outer circumferential surplus region 17b in the thickness direction of the workpiece 11. Incidentally, at each outer circumferential part on the side of the front surface 11a and on the side of the back surface 11b, a beveled part is formed as illustrated in FIG. 3.

When the workpiece 11 is processed, the side of the back surface 11b of the workpiece 11 is stuck to the central part of a circular tape 21 and an annular frame 23 (see FIG. 3 and FIG. 4) made of a metal is stuck to the outer circumferential part of the tape 21 (tape sticking step S10). FIG. 3 is a diagram illustrating the tape sticking step S10. The tape 21 has a base layer made of a resin and an adhesive layer (glue layer) disposed on the whole of one surface of the base layer. The adhesive layer is formed of an ultraviolet-curable resin, for example.

Figure 4:
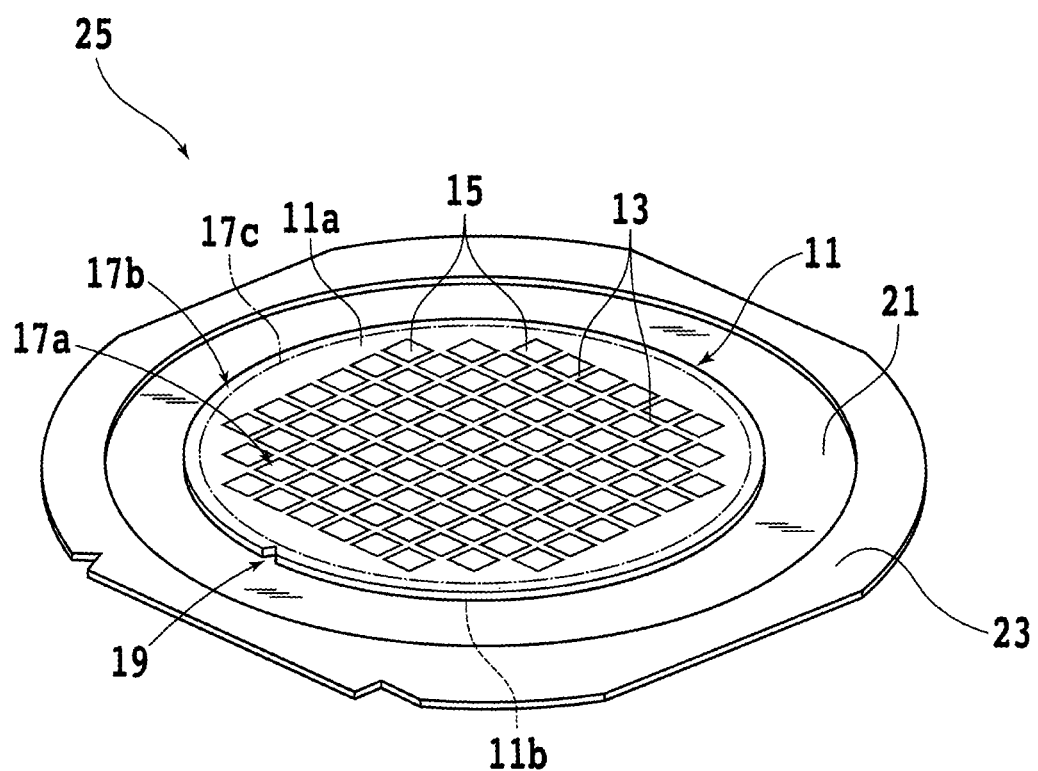
FIG. 4 is a perspective view of a workpiece unit.
Figure 5:
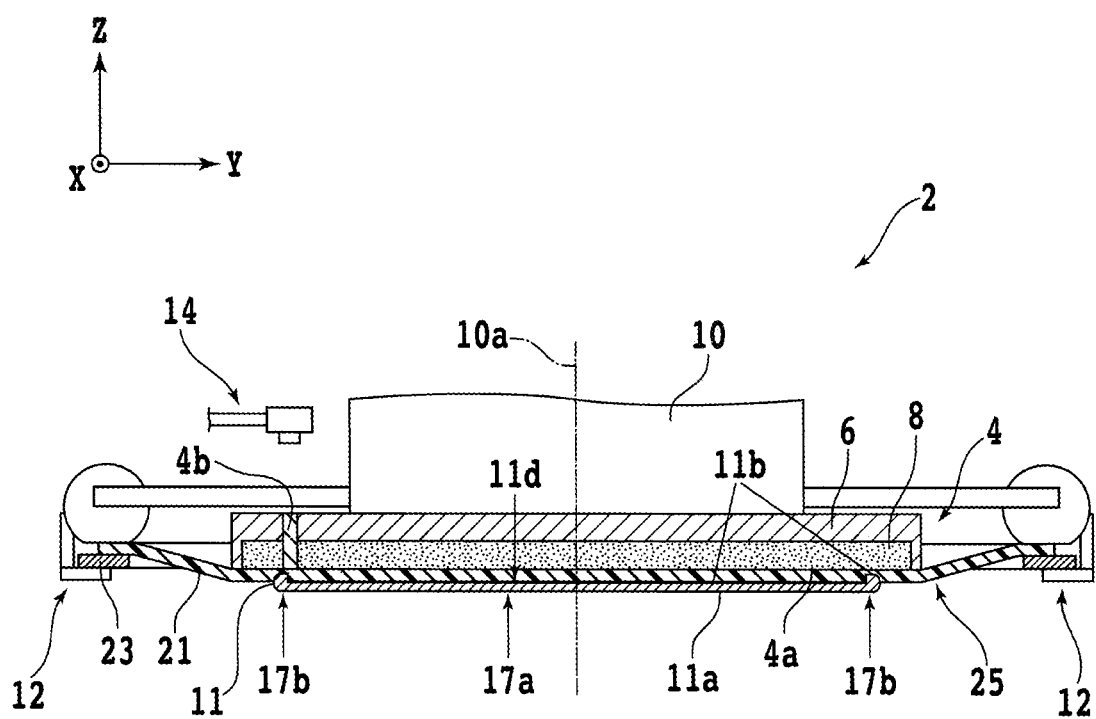
FIG. 5 is a diagram illustrating a holding step.

In the tape sticking step S10, for example, first, the workpiece 11 is disposed in such a manner that the back surface 11b is oriented upward and subsequently the frame 23 is disposed outside the outer circumferential part of the workpiece 11. Thereafter, the adhesive layer side of the tape 21 is stuck to the back surface 11b of the workpiece 11 and one surface of the frame 23. Thereby, a workpiece unit 25 (see FIG. 4) in which the workpiece 11 and the frame 23 are integrated through the tape 21 is formed. FIG. 4 is a perspective view of the workpiece unit 25. After the tape sticking step S10, the workpiece unit 25 is held under suction by a chuck table (holding unit) 4 that is disposed in a laser processing apparatus 2 and has a circular disc shape (holding step S20) (see FIG. 5). FIG. 5 is a diagram illustrating the holding step S20.

Here, the configuration of the laser processing apparatus 2 will be described. The above-described chuck table 4 is disposed in such a manner that a holding surface 4a is oriented downward. The chuck table 4 has a frame body 6 that is formed of a metal and has a circular disc shape. A recess part with a circular disc shape is formed at the lower part of the frame body 6. A porous plate 8 that is formed of porous ceramic and has a circular disc shape is fixed into the recess part of the frame body 6. The lower surface of the frame body 6 and the lower surface of the porous plate 8 are flush with each other and configure the substantially flat holding surface 4a.

A flow path (not illustrated) is formed in the frame body 6. One end of the flow path is connected to a suction source (not illustrated) such as an ejector and the other end of the flow path is connected to the porous plate 8. When the suction source is operated, a negative pressure is transmitted to the holding surface 4a. A transmissive part 4b with a circular column shape is disposed at part of the frame body 6 and the porous plate 8. The transmissive part 4b is formed of a material (for example, optical glass) having transparency or translucency with respect to a laser beam L to be described later. The transmissive part 4b penetrates from the lower surface of the porous plate 8 to the upper surface of the frame body 6. Although only one transmissive part 4b is disposed in the present embodiment, plural transmissive parts 4b may be disposed discretely along the radial direction of the chuck table 4.

An output shaft of a rotation mechanism 10 having a motor or the like is coupled to the upper part of the frame body 6. The rotation mechanism 10 can rotate the chuck table 4 around a rotation axis 10a. A horizontal movement mechanism (not illustrated) for moving the rotation mechanism 10 in an X-axis direction and a Y-axis direction is coupled to the upper part of the rotation mechanism 10. A light detection unit 14 is disposed above the chuck table 4 and at a side part of the rotation mechanism 10. The light detection unit 14 is a power meter, a power sensor, a camera with a neutral-density filter, or the like and can detect the laser beam L transmitted through the transmissive part 4b.

Plural clamp mechanisms 12 are disposed at side parts of the rotation mechanism 10. In the present embodiment, four clamp mechanisms 12 are disposed discretely along the circumferential direction of the chuck table 4. Incidentally, in FIG. 5, two clamp mechanisms 12 are illustrated. When the workpiece unit 25 is held under suction by the holding surface 4a in the state in which the front surface 11a is exposed to the lower side, for the workpiece 11, the side of the back surface 11b is held by the holding surface 4a with the interposition of the tape 21. Furthermore, the frame 23 is clamped by the clamp mechanisms 12.

A laser beam irradiation unit 16 is disposed below the chuck table 4 (see FIG. 6). The laser beam irradiation unit 16 includes a laser oscillator (not illustrated) for generating a pulsed laser beam having such a wavelength as to be absorbed by the workpiece 11. A laser beam emitted from the laser oscillator goes through a predetermined optical system and is output upward from a light collector 18 including a collecting lens toward the holding surface 4a. Incidentally, to the light collector 18, a Z-axis movement mechanism (not illustrated) that moves the light collector 18 along a Z-axis direction and an angle adjustment unit (not illustrated) that adjusts the angle of incidence of the laser beam are coupled.

In the laser processing apparatus 2, a control part (not illustrated) that controls operation of the chuck table 4, the laser beam irradiation unit 16, the horizontal movement mechanism (not illustrated), the Z-axis movement mechanism (not illustrated), the angle adjustment unit (not illustrated), and so forth is disposed. For example, the control part is configured by a computer including a processor (processing device) typified by a central processing unit (CPU), a main storing device such as a dynamic random access memory (DRAM), static random access memory (SRAM), or read only memory (ROM), and an auxiliary storing device such as a flash memory, hard disk drive, or solid state drive. Software including a predetermined program is stored in the auxiliary storing device. Functions of the control part are implemented by causing the processing device and so forth to operate in accordance with this software. Next, a laser beam irradiation step S30 subsequent to the holding step S20 will be described with reference to FIG. 6 and FIG. 7.

Figure 6:
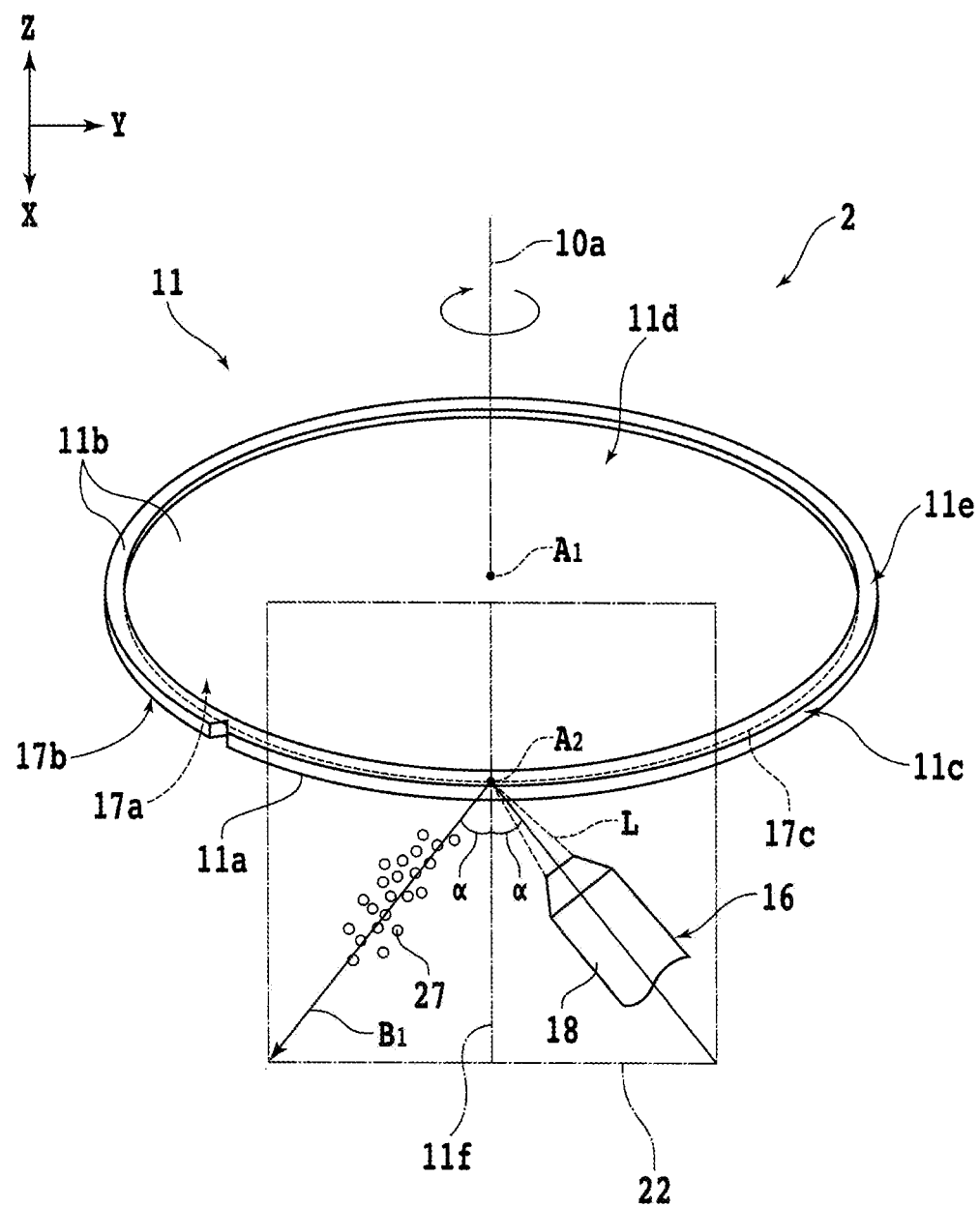
FIG. 6 is a perspective view illustrating one aspect of a laser beam irradiation step.
Figure 7:
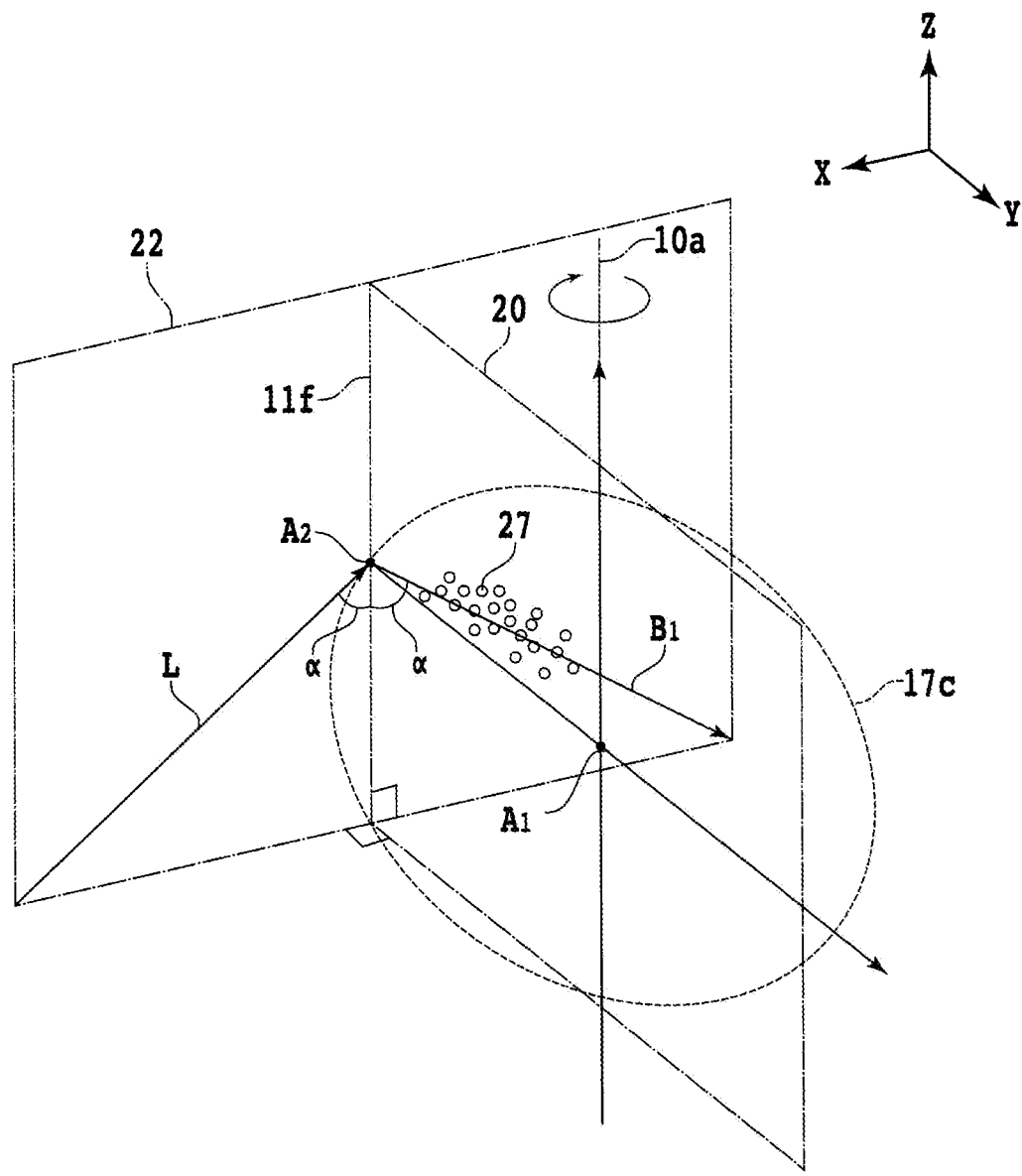
FIG. 7 is a schematic diagram of FIG. 6.

FIG. 6 is a perspective view illustrating one aspect of the laser beam irradiation step S30. FIG. 7 is a schematic diagram of FIG. 6. Note that FIG. 7 is drawn from a different point of view from FIG. 6. In FIG. 6 and FIG. 7, the chuck table 4, the tape 21, the frame 23, and so forth are omitted for convenience. In the laser beam irradiation step S30, the front surface 11a of the workpiece 11 is irradiated with the laser beam L from the light collector 18 located below the workpiece unit 25 (that is, from the side of the front surface 11a). That is, irradiation with the laser beam L that travels from the lower side toward the upper side is executed.

In particular, in the laser beam irradiation step S30 in the present embodiment, a plane 22 of incidence of the laser beam L is set orthogonal to a virtual plane 20 that passes through a center $A_1$ of the front surface 11a and a focal point $A_2$ of the laser beam L and is orthogonal to the front surface 11a (see FIG. 7). Moreover, the orientation of the laser beam L is adjusted in such a manner that the laser beam L has an angle α of incidence (acute angle) formed due to inclination with respect to a normal 11f to the front surface 11a by a predetermined angle, and the focal point $A_2$ is positioned to one point on the boundary part 17c (annular region).

Figure 8A:
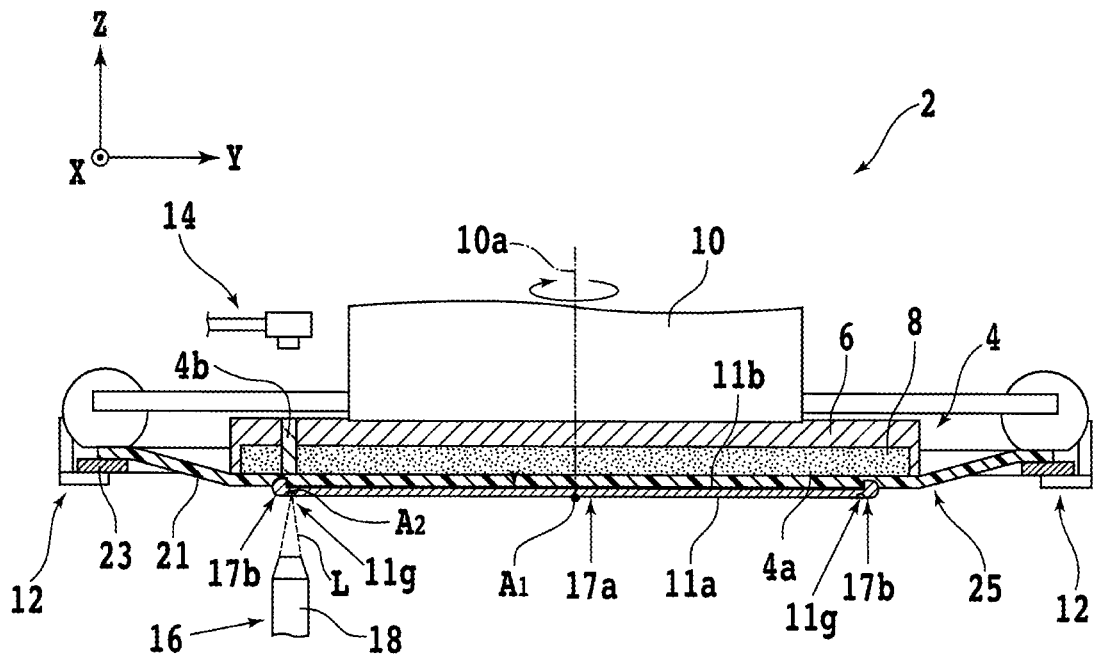
FIG. 8A is a diagram illustrating a state in which a processing groove is being formed.

In this state, by rotating the chuck table 4 around the rotation axis 10a, the front surface 11a is irradiated with the laser beam L and ablation processing is executed along the outer circumferential edge 11c. Thereby, a processing groove 11g with a form of being orthogonal to the front surface 11a is annularly formed along the boundary part 17c (see FIG. 8A). FIG. 8A is a diagram illustrating the state in which the processing groove 11g is being formed. For example, laser processing conditions are set as follows when the thickness of the workpiece 11 in the device region 17a is 100 μm.

Laser Medium of the Laser Oscillator: Yb-Doped Fiber
Wavelength: at least 1059 nm and at most 1065 nm
Repetition frequency: 50 kHz
Average output power: 17 W
Processing feed rate: 163 rpm
Focal spot diameter: 25 μm As the laser processing proceeds, the processing groove 11g gradually becomes deeper. When the processing groove 11g penetrates the workpiece 11, the workpiece 11 is separated into the device region 17a and the outer circumferential surplus region 17b with the processing groove 11g being the boundary (see FIG. 8B). In the laser beam irradiation step S30 of the present embodiment, the front surface 11a is irradiated with the laser beam L in such a manner that the laser beam L has the angle α of incidence formed due to inclination with respect to the normal 11f to the front surface 11a of the workpiece 11 by a predetermined angle. Thus, even when the laser beam L is reflected by the front surface 11a, reflection with the angle α of reflection is caused and return of the laser beam L to the laser oscillator can be suppressed.

Therefore, the state of the laser oscillator is less liable to become unstable and thus the possibility of processing failure in the laser processing can be reduced. In addition, due to making the laser beam L be incident with the angle α of incidence, debris 27 is scattered along a traveling direction $B_1$ of the laser beam L with the angle α of reflection (see FIG. 6 and FIG. 7). Therefore, adhesion of the debris 27 to the collecting lens can be reduced. Incidentally, at the time of laser processing, an air jet nozzle (not illustrated) may be disposed directly under the center $A_1$ of the front surface 11a and air may be jetted from the center $A_1$ toward the focal point $A_2$. This can more surely prevent the debris 27 generated by the ablation processing from adhering to the device region 17a.

Figure 8B:
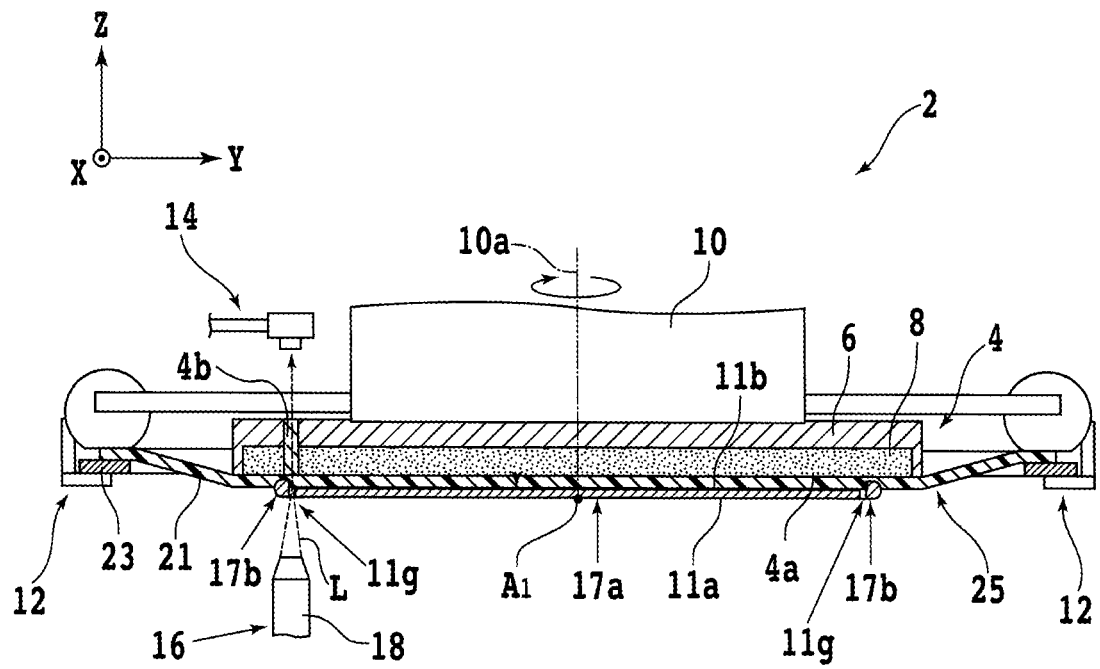
FIG. 8B is a diagram illustrating a detection step.

Incidentally, the laser beam irradiation step S30 in the present embodiment includes a detection step S35 of detecting the laser beam L that has passed through the processing groove 11g by the light detection unit 14 when the processing groove 11g has penetrated the workpiece 11. FIG. 8B is a diagram illustrating the detection step S35. When receiving light with intensity equal to or higher than a predetermined value, the light detection unit 14 transmits a predetermined light reception signal to the control part. Therefore, whether or not the processing groove 11g has penetrated the workpiece 11 can be automatically detected by using the light detection unit 14. After the penetration is detected, the irradiation with the laser beam L is stopped. Incidentally, after the detection step S35 and before the stop of the irradiation with the laser beam L, a cleaning step may be executed in which the output power of the laser beam L is set low compared with the above-described laser processing condition and debris that adheres to the vicinity of the processing groove 11g is removed.

After the laser beam irradiation step S30, the outer circumferential surplus region 17b separated into a ring shape from the device region 17a is removed from the tape 21 (removal step S40). For example, the chuck table 4 is rotated in the state in which wedges (not illustrated) are inserted between the tape 21 and the back surface 11b at plural places in the circumferential direction of the outer circumferential surplus region 17b. Thereby, the outer circumferential surplus region 17b is dropped from the tape 21. In the removal step S40, the outer circumferential surplus region 17b may be dropped from the tape 21 by pulling down claw parts (not illustrated) in the state in which, instead of the wedges, the claw parts are inserted between the tape 21 and the back surface 11b at plural places in the circumferential direction of the outer circumferential surplus region 17b.

First Modification Example

Figure 9A:
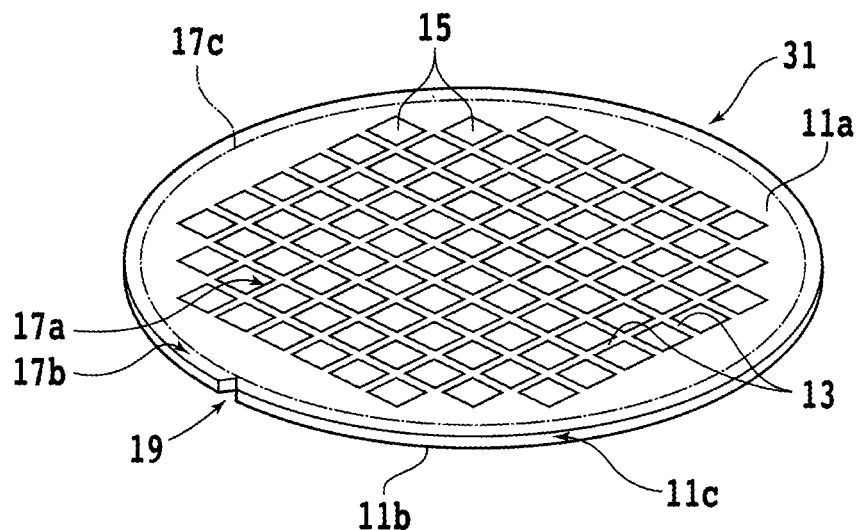
FIG. 9A is a perspective view of a workpiece according to a first modification example.
Figure 9B:
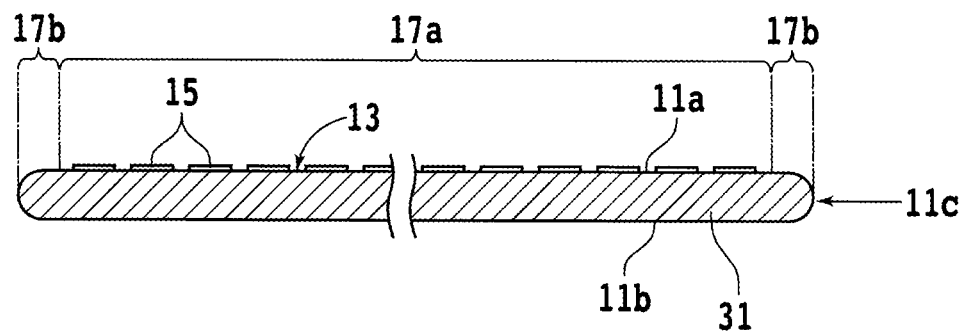
FIG. 9B is a sectional view of the workpiece according to the first modification example.

Next, various modification examples in the first embodiment will be described. FIG. 9A is a perspective view of a workpiece 31 according to a first modification example. FIG. 9B is a sectional view of the workpiece 31 according to the first modification example. The workpiece 31 of the first modification example is different from the above-described workpiece 11 in that the circular recess part 11d is not formed on the side of the back surface 11b. By executing the steps from the tape sticking step S10 to the removal step S40 similarly for the workpiece 31, a region including a beveled part formed at the outer circumferential edge of the workpiece 31 can be removed.

Second Modification Example

Figure 10:
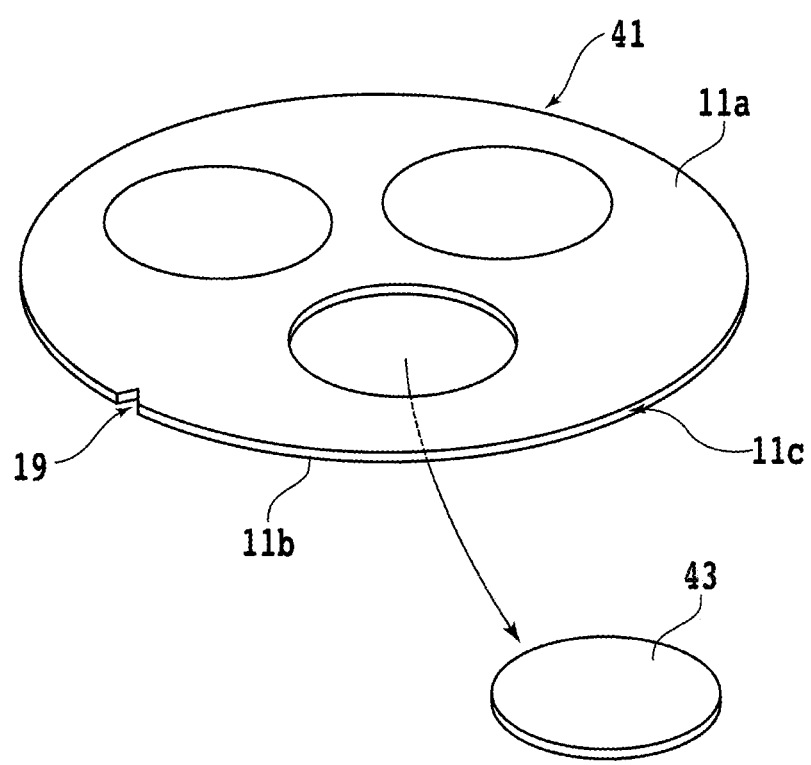
FIG. 10 is a perspective view of a workpiece according to a second modification example.

FIG. 10 is a perspective view of a workpiece 41 according to a second modification example. The devices 15 are not formed in the workpiece 41. For example, a workpiece 43 with a smaller diameter than the workpiece 41 can be formed from the workpiece 41 by forming the processing groove 11g along a predetermined circle having a diameter smaller than the diameter of the workpiece 41.

Third Modification Example

Figure 11:
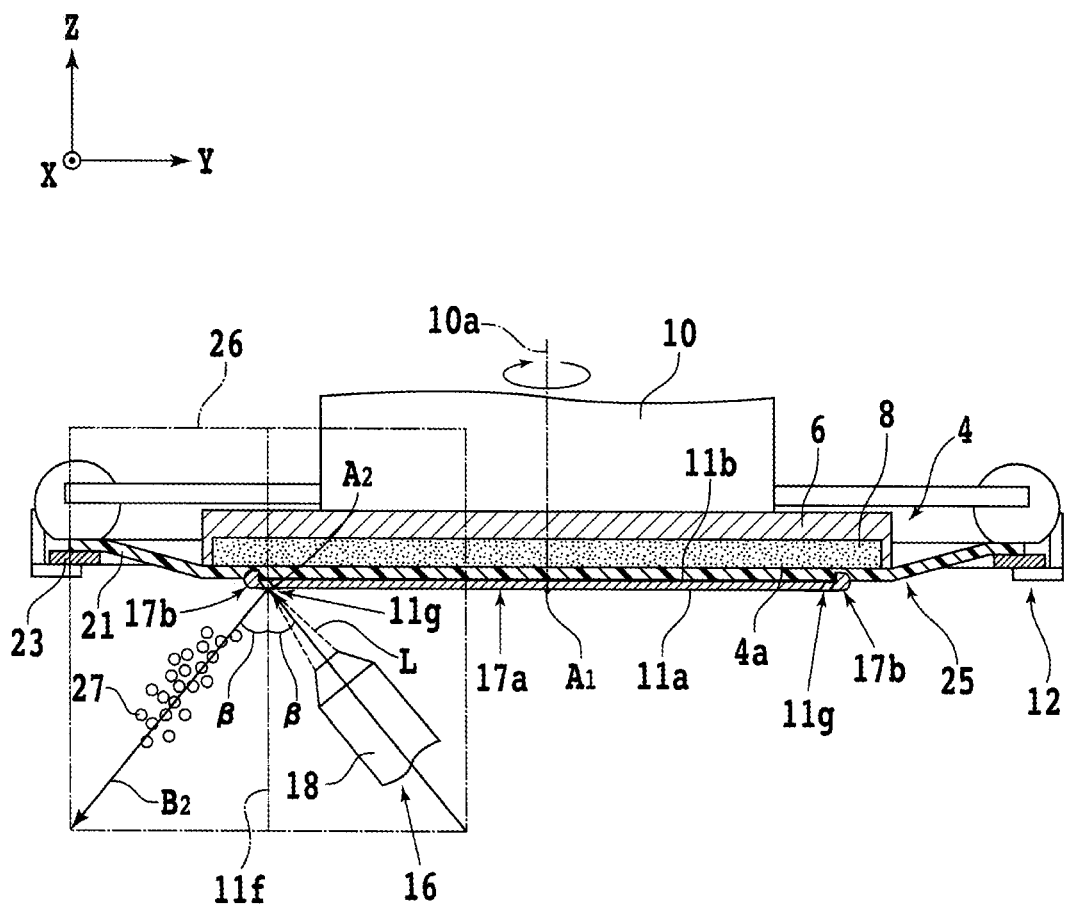
FIG. 11 is a diagram illustrating the laser beam irradiation step according to a third modification example.
Figure 12:
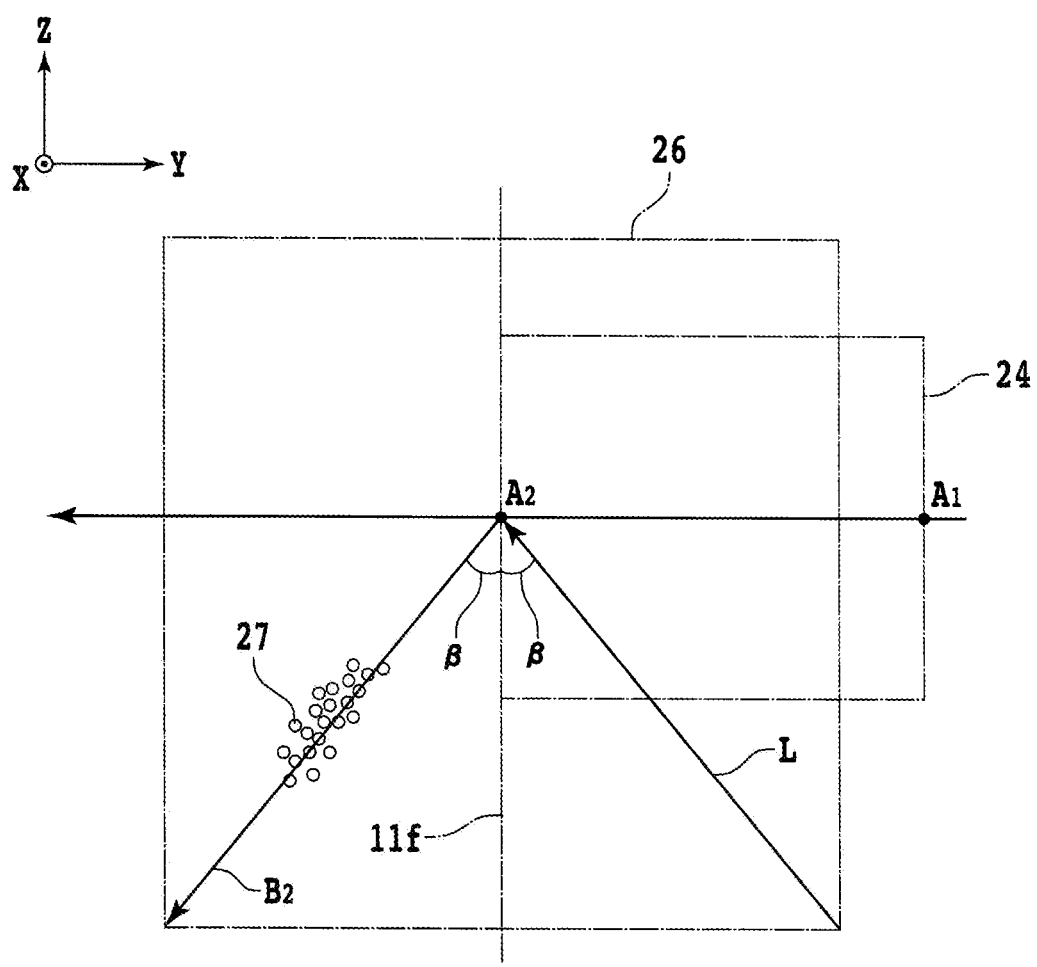
FIG. 12 is a schematic diagram of FIG. 11.

Next, a modification example of the laser beam irradiation step S30 will be described. FIG. 11 is a diagram illustrating the laser beam irradiation step S30 according to a third modification example. FIG. 12 is a schematic diagram of FIG. 11. In the laser beam irradiation step S30 according to the third modification example, a state is made in which a plane 26 of incidence of the laser beam L is set parallel to a virtual plane 24 that passes through the center $A_1$ of the front surface 11a and the focal point $A_2$ of the laser beam L and is orthogonal to the front surface 11a. Moreover, the orientation of the laser beam L is adjusted in such a manner that the laser beam L has an angle β of incidence (acute angle) formed due to inclination with respect to the normal 11f to the front surface 11a by a predetermined angle, and the focal point $A_2$ is positioned to one point on the boundary part 17c (annular region).

In this state, by rotating the chuck table 4 around the rotation axis 10a, irradiation with the laser beam L that obliquely travels from the side of the center $A_1$ of the front surface 11a toward the outside of the front surface 11a is executed and ablation processing is executed along the outer circumferential edge 11c. Laser processing conditions may be the same as the above-described conditions. As the laser processing proceeds, the processing groove 11g gradually becomes deeper. When the processing groove 11g penetrates the workpiece 11, the workpiece 11 is separated into the device region 17a and the outer circumferential surplus region 17b with the processing groove 11g being the boundary. At this time, the workpiece 11 on the side of the device region 17a becomes a reversed circular truncated cone shape. Therefore, there is an advantage that the inner circumferential side surface of the outer circumferential surplus region 17b is less liable to interfere with the outer circumferential side surface of the device region 17a in the removal step S40.

In the laser beam irradiation step S30 according to the third modification example, the front surface 11a is irradiated with the laser beam L in such a manner that the laser beam L has the angle β of incidence formed due to inclination with respect to the normal 11f to the front surface 11a of the workpiece 11 by a predetermined angle. Thus, even when the laser beam L is reflected by the front surface 11a, reflection with the angle β of reflection is caused and return of the laser beam L to the laser oscillator can be suppressed. Therefore, the state of the laser oscillator is less liable to become unstable and thus the possibility of processing failure in the laser processing can be reduced. In addition, due to making the laser beam L have the angle β of incidence, the debris 27 is scattered along a traveling direction $B_2$ of the laser beam L with the angle β of reflection. Therefore, adhesion of the debris 27 to the collecting lens can be reduced. Incidentally, at the time of laser processing, an air jet nozzle (not illustrated) may be disposed directly under the center $A_1$ of the front surface 11a and air may be jetted from the center $A_1$ toward the focal point $A_2$. Furthermore, the detection step S35 may be executed in the third modification example. By executing the detection step S35, whether or not the processing groove 11g has penetrated the workpiece 11 can be automatically detected.

Fourth Modification Example

Figure 13:
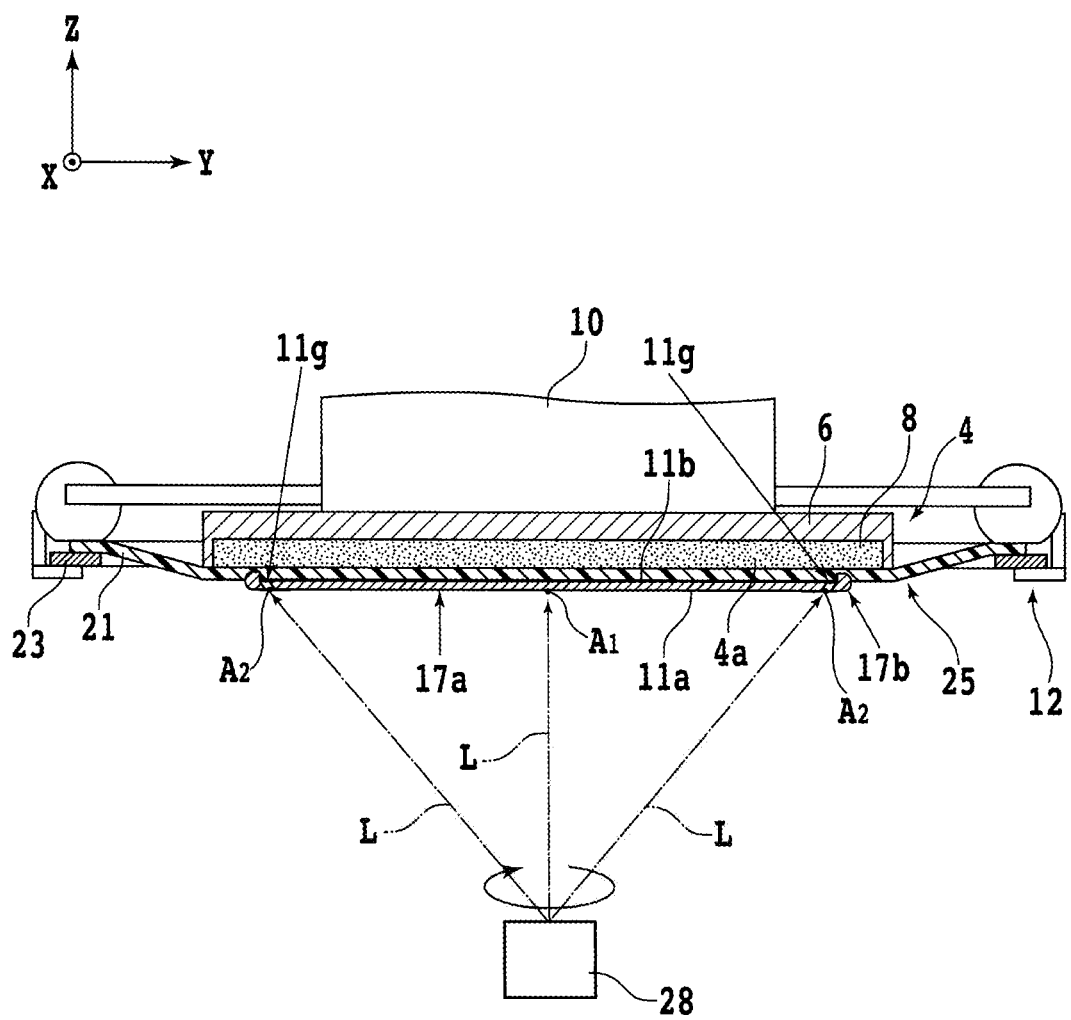
FIG. 13 is a diagram illustrating the laser beam irradiation step according to a fourth modification example.

Next, a fourth modification example obtained by modifying the third modification example will be described. FIG. 13 is a diagram illustrating the laser beam irradiation step S30 according to the fourth modification example. Also in the fourth modification example, similarly to the third modification example, the boundary part 17c of the front surface 11a is irradiated with the laser beam L in the state in which the plane 26 of incidence is set parallel to a virtual plane 24 that passes through the center $A_1$ and the focal point $A_2$ and is orthogonal to the front surface 11a. However, in the fourth modification example, in the state in which the chuck table 4 is not rotated but set still, the irradiation position of the laser beam L is controlled in such a manner that scanning with the focal point $A_2$ is executed along the boundary part 17c by using a galvanometer scanner 28 disposed to face the holding surface 4a (that is, front surface 11a). Also in the fourth modification example, effects similar to those of the third modification example can be provided. That is, the detection step S35 may be executed by using the light detection unit 14.

Figure 14:
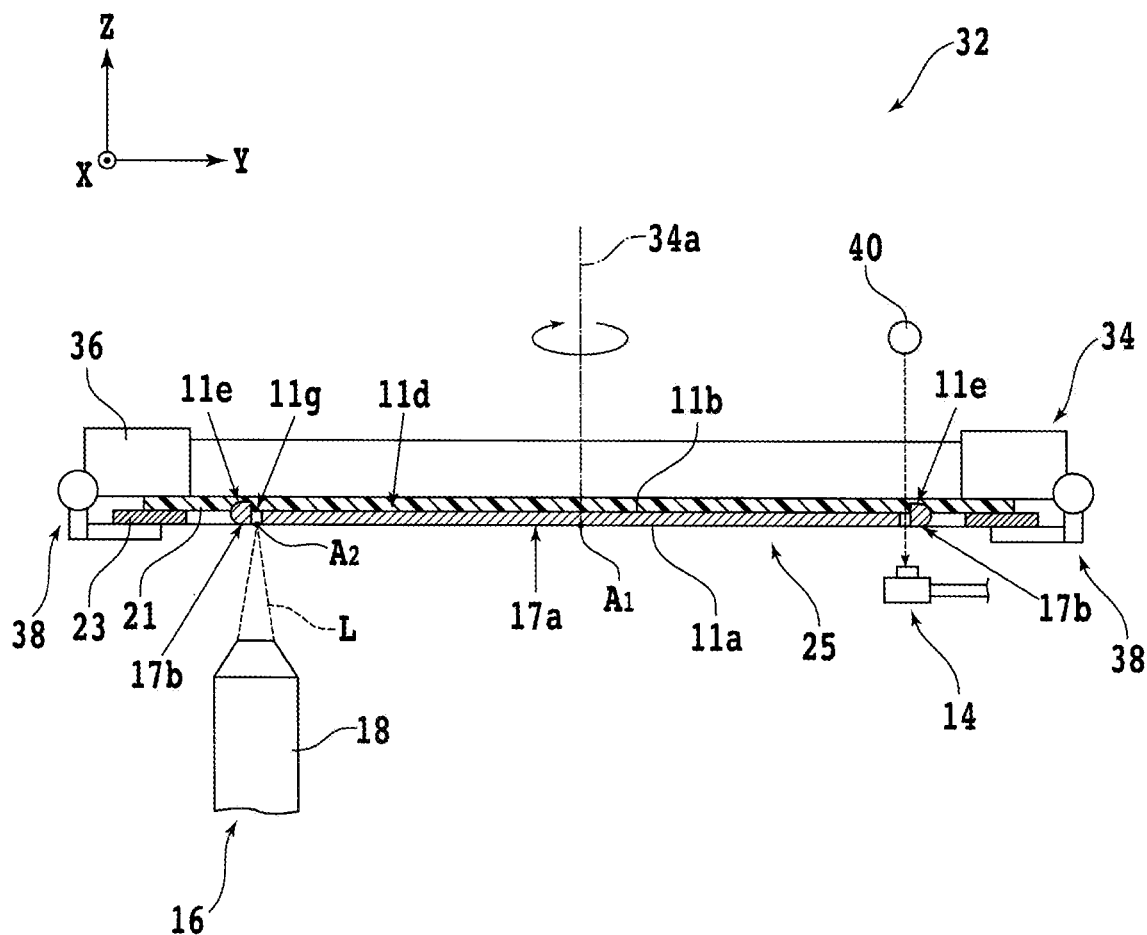
FIG. 14 is a diagram illustrating the detection step according to a second embodiment.

Next, a second embodiment will be described with reference to FIG. 14. A laser processing apparatus 32 of the second embodiment includes a holding ring (holding unit) 34 instead of the chuck table 4. The holding ring 34 has a ring-shaped casing 36 and plural clamp mechanisms 38 discretely disposed around the casing 36. The holding ring 34 is coupled to a rotation mechanism (not illustrated) similar to that for the chuck table 4 and can rotate around a rotation axis 34a that passes through the center position of the casing 36. Below the holding ring 34, the laser beam irradiation unit 16 is disposed in such a form as to be capable of outputting the laser beam L upward.

The above-described light detection unit 14 is disposed on the opposite to the light collector 18 of the laser beam irradiation unit 16 with the interposition of the rotation axis 34a between them in the horizontal direction. A light source 40 that emits light downward is disposed above the light detection unit 14. The light source 40 is a laser diode, for example. A laser beam from the light source 40 has such a wavelength that it is hard for the laser beam to be transmitted through the workpiece 11 and the laser beam is transmitted through the tape 21 (for example, wavelength in the ultraviolet band), and has low output power compared with the laser beam L to process the workpiece 11. More specifically, the output power of the laser beam from the light source 40 is so low as not to process the workpiece 11 (that is, lower than the processing threshold of the workpiece 11). The laser beam from the light source 40 is output toward the light detection unit 14.

Also in the second embodiment, when the workpiece 11 is processed, the steps from the tape sticking step S10 to the removal step S40 are sequentially executed. After the workpiece unit 25 is formed in the tape sticking step S10, the workpiece 11 is held with the interposition of the tape 21 by holding the frame 23 by the holding ring 34 (holding step S20). Subsequently, similarly to the first embodiment, in the state in which the plane 22 of incidence of the laser beam L is set orthogonal to the virtual plane 20 (see FIG. 7), the orientation of the laser beam L is adjusted in such a manner that the laser beam L has the angle α of incidence (acute angle) formed due to inclination with respect to the normal 11f to the front surface 11a by a predetermined angle, and the focal point $A_2$ is positioned to one point on the boundary part 17c (annular region) (see FIG. 6 and FIG. 7).

Moreover, ablation processing is executed along the outer circumferential edge 11c by rotating the holding ring 34 around the rotation axis 34a. Thereby, the processing groove 11g with a form of being orthogonal to the front surface 11a is annularly formed along the boundary part 17c. That is, also in the second embodiment, return of the laser beam L to the laser oscillator can be suppressed and thus the state of the laser oscillator is less liable to become unstable. Therefore, the possibility of processing failure in the laser processing can be reduced.

However, in the detection step S35 in the second embodiment, whether or not the processing groove 11g has penetrated the workpiece 11 is detected by detecting the laser beam emitted from the light source 40 by the light detection unit 14. FIG. 14 is a diagram illustrating the detection step S35 according to the second embodiment. In the present embodiment, the detection step S35 can be executed by using the light source 40 with low output power. Therefore, a neutral-density filter or the like does not need to be disposed for the light detection unit 14 and thus the cost can be reduced. Furthermore, there is an advantage that a burn is less liable to occur in sensor element, filter, and so forth and therefore trouble such as breakdown of the light detection unit 14 is less liable to occur.

Moreover, in the subsequent removal step S40, the whole of the side of the back surface 11b of the workpiece 11 is irradiated with ultraviolet rays after a light blocking plate (not illustrated) with substantially the same diameter as the circular recess part 11d is disposed on the tape 21. Thereby, the adhesive force between the annular projection part 11e and the tape 21 is lowered. Thereafter, the outer circumferential surplus region 17b separated into a ring shape from the circular recess part 11d is removed from the tape 21 by using the above-described claw part or the like (removal step S40). Furthermore, in the removal step S40, the outer circumferential surplus region 17b is removed from the tape 21 after the adhesive force of the tape 21 is reduced. Therefore, the device region 17a can be stably stuck to the tape 21 and the outer circumferential surplus region 17b can be easily removed. Besides, based on the same arrangement, configuration, and so forth as the first embodiment, similar effects can be provided. In addition, the first to the fourth modification examples may be applied to the second embodiment.

Figure 15A:
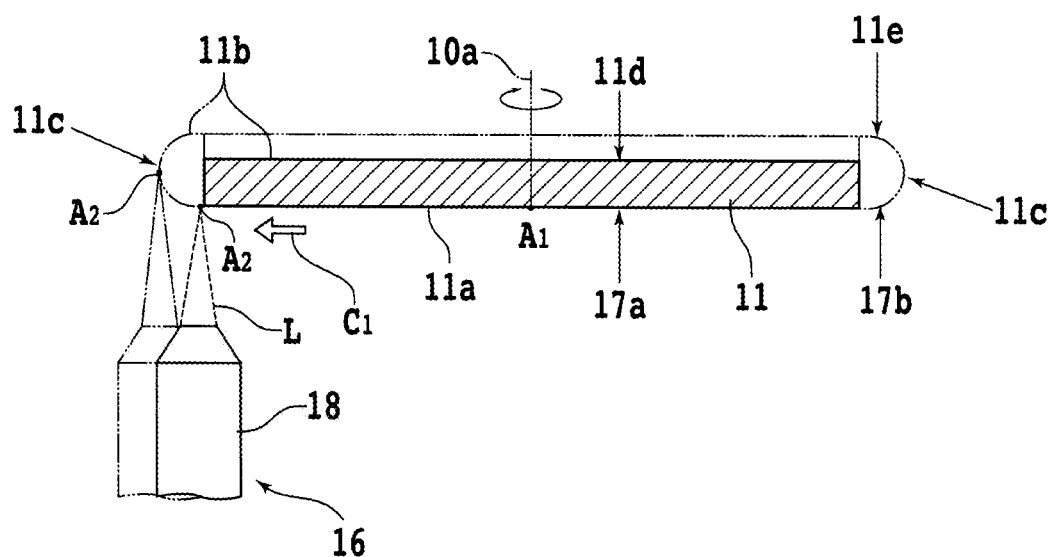
FIG. 15A is a diagram illustrating one example of the laser beam irradiation step according to a third embodiment.
Figure 15B:
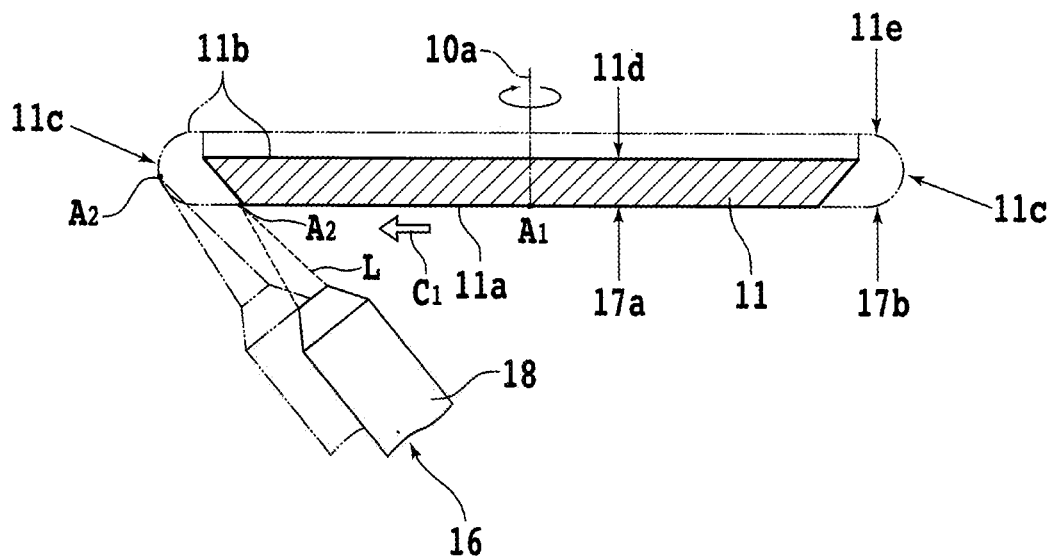
FIG. 15B is a diagram illustrating another example of the laser beam irradiation step according to the third embodiment.

Next, a third embodiment will be described. The laser beam irradiation step S30 in the third embodiment is different from the first and second embodiments in that the part corresponding to the outer circumferential surplus region 17b in the thickness direction of the workpiece 11 is subjected to ablation to be removed. FIG. 15A is a diagram illustrating one example of the laser beam irradiation step S30 according to the third embodiment. In FIG. 15A and FIG. 15B, the chuck table 4, the tape 21, the frame 23, and so forth are omitted for convenience.

In the example illustrated in FIG. 15A, as in the first embodiment (see FIG. 6 to FIG. 8B), irradiation with the laser beam L is executed in such a manner that the laser beam L has the angle α of incidence (acute angle) formed due to inclination with respect to the normal 11f to the front surface 11a by a predetermined angle in the state in which the plane 22 of incidence of the laser beam L is set orthogonal to the virtual plane 20. In this manner, the focal point $A_2$ is positioned to the outer circumferential edge 11c. Then, while the chuck table 4 is rotated around the rotation axis 10a, the rotation axis 10a is gradually brought closer to the focal point $A_2$ as depicted by an arrow $C_1$. Note that the height position of the focal point $A_2$ of the laser beam L may be adjusted as appropriate.

Furthermore, the focal point $A_2$ may be moved from a position separate inward from the outer circumferential edge 11c by a predetermined distance to the outer circumferential edge 11c, and the laser beam irradiation unit 16 may be moved in the horizontal direction with the chuck table 4 rotated without being moved in the horizontal direction. Moreover, when the spot diameter of the focal point $A_2$ is sufficiently large, the chuck table 4 may be rotated without moving the chuck table 4 and the laser beam irradiation unit 16 in the horizontal direction.

By irradiating the outer circumferential surplus region 17b to the position separate inward from the outer circumferential edge 11c by the predetermined distance with the laser beam L, the part corresponding to the outer circumferential surplus region 17b in the thickness direction of the workpiece 11 can be removed. Thus, the removal step S40 can be omitted. Furthermore, in the laser beam irradiation step S30, by setting the plane 22 of incidence of the laser beam L parallel to the virtual plane 20, the part corresponding to the outer circumferential surplus region 17b in the thickness direction of the workpiece 11 may be removed by ablation similarly to the third modification example of the first embodiment (see FIG. 11 and FIG. 12).

FIG. 15B is a diagram illustrating another example of the laser beam irradiation step S30 according to the third embodiment. Also in FIG. 15B, the chuck table 4 and so forth are omitted for convenience. In the example illustrated in FIG. 15B, as in FIG. 11 to FIG. 13, irradiation with the laser beam L is executed in such a manner that the laser beam L has the angle β of incidence (acute angle) formed due to inclination with respect to the normal 11f to the front surface 11a by a predetermined angle in the state in which the plane 22 of incidence of the laser beam L is set parallel to the virtual plane 20. In this manner, the focal point $A_2$ is positioned to the outer circumferential edge 11c. Then, while the chuck table 4 is rotated around the rotation axis 10a, the rotation axis 10a is gradually brought closer to the focal point $A_2$ as depicted by the arrow $C_1$. Note that the height position of the focal point $A_2$ of the laser beam L may be adjusted as appropriate.

Also in the example of FIG. 15B, as described in the explanation of FIG. 15A, the focal point $A_2$ may be moved from the inside of the workpiece 11 to the outside, and the laser beam irradiation unit 16 may be moved in the horizontal with the chuck table 4 rotated without being moved in the horizontal direction. Moreover, when the spot diameter of the focal point $A_2$ is sufficiently large, the chuck table 4 may be rotated without moving the chuck table 4 and the laser beam irradiation unit 16 in the horizontal direction. By irradiating the outer circumferential surplus region 17b to a position separate inward from the outer circumferential edge 11c by a predetermined distance with the laser beam L, the part corresponding to the outer circumferential surplus region 17b in the thickness direction of the workpiece 11 can be removed. Note that it is also possible to apply the galvanometer scanner 28 as in the fourth modification example of the first embodiment (see FIG. 13).

Figure 16:
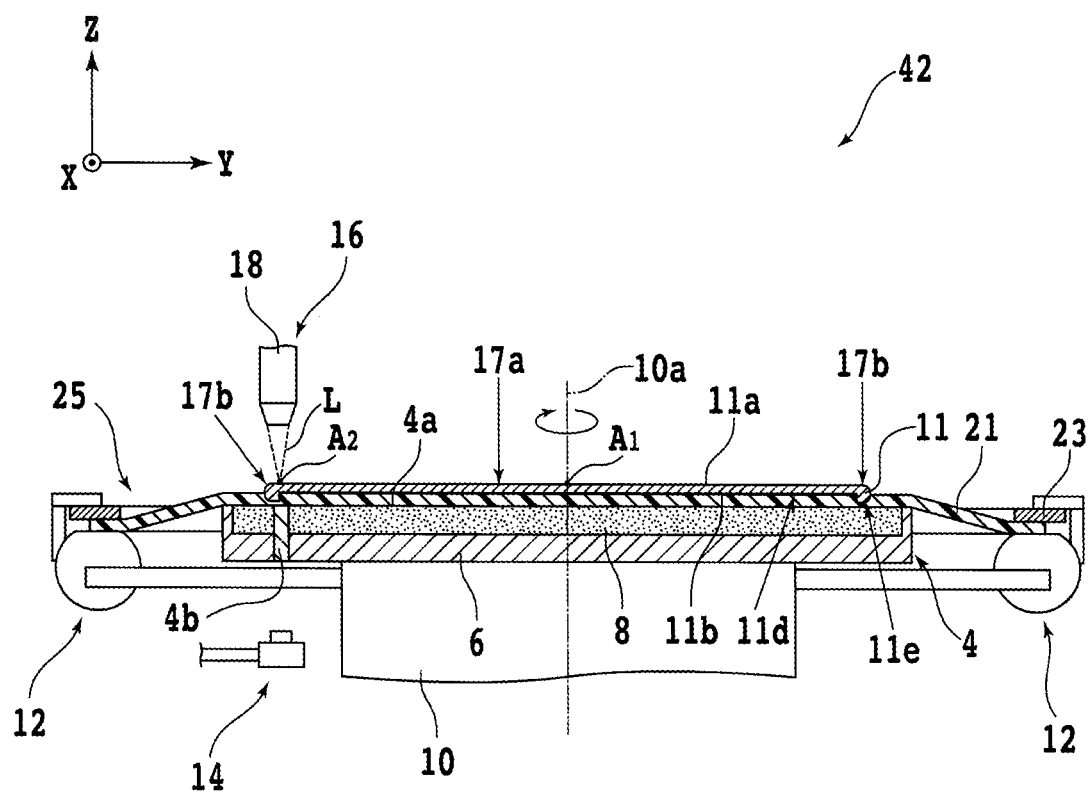
FIG. 16 is a partial sectional side view illustrating a laser processing apparatus according to a fourth embodiment.

Next, a fourth embodiment will be described. FIG. 16 is a partial sectional side view illustrating a laser processing apparatus 42 according to the fourth embodiment. In the laser processing apparatus 42, the chuck table 4 is disposed in such a manner that the holding surface 4a is oriented upward, and the laser beam irradiation unit 16 is disposed above the holding surface 4a. Also in the fourth embodiment, the processing groove 11g can be formed at the boundary part 17c similarly to the first embodiment (see FIG. 6 to FIG. 8B), the third modification example of the first embodiment (see FIG. 11 and FIG. 12), or the fourth modification example of the first embodiment (see FIG. 13).

That is, the workpiece 31 according to the first modification example of the first embodiment (see FIG. 9A and FIG. 9B) may be processed. Furthermore, from the workpiece 41 according to the second modification example of the first embodiment, the workpiece 43 with a smaller diameter may be formed (see FIG. 10). Moreover, instead of the chuck table 4, the holding ring 34 may be employed as in the second embodiment (see FIG. 14). Furthermore, instead of forming the processing groove 11g, the part corresponding to the outer circumferential surplus region 17b in the thickness direction of the workpiece 11 may be removed by ablation as in the third embodiment (see FIG. 15A and FIG. 15B). Besides, structures, methods, and so forth according to the above-described embodiments can be executed with appropriate changes without departing from the range of the object of the present invention.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A processing method of a workpiece with a circular disc shape, the workpiece being a semiconductor wafer, the processing method comprising:

a tape sticking step of sticking a tape to one surface of the workpiece and integrating the workpiece and a frame through the tape;

a holding step of holding the workpiece by a holding unit with interposition of the tape after the tape sticking step; and a laser beam irradiation step of irradiating the other surface of the workpiece located on an opposite side to the one surface with a pulsed laser beam having such a wavelength as to be absorbed by the workpiece from a side of the other surface after the holding step, wherein, in the laser beam irradiation step, the semiconductor wafer is ablation processed wherein the other surface is annularly irradiated with the laser beam in a state in which orientation of the laser beam is adjusted in such a manner that the laser beam has an angle of incidence formed due to inclination with respect to a normal to the other surface of the workpiece by a predetermined angle.

2. The processing method of a workpiece according to claim 1, wherein
the workpiece is held in a state in which the other surface is exposed to a lower side in the holding step, and
irradiation with the laser beam that travels from the lower side toward an upper side is executed in the laser beam irradiation step.

3. The processing method of a workpiece according to claim 1, wherein,
in the laser beam irradiation step, an annular processing groove having a predetermined diameter on the side of the other side is formed inside an outer circumferential edge of the workpiece to separate the workpiece with the processing groove being a boundary.

4. The processing method of a workpiece according to claim 1, wherein
the workpiece has, on the side of the other surface, a device region in which a plurality of devices are formed and an outer circumferential surplus region that surrounds the device region and is a range to a position separate inward from an outer circumferential edge of the workpiece by a predetermined distance,
the workpiece has, on a side of the one surface, a circular recess part corresponding to the device region and an annular projection part that surrounds outside of the circular recess part and corresponds to the outer circumferential surplus region, and
a boundary part between the device region and the outer circumferential surplus region on the side of the other surface is irradiated with the laser beam in the laser beam irradiation step.

5. The processing method of a workpiece according to claim 1, wherein
the workpiece has, on the side of the other surface, a device region in which a plurality of devices are formed and an outer circumferential surplus region that surrounds the device region and is a range to a position separate inward from an outer circumferential edge of the workpiece by a predetermined distance,
the workpiece has, on a side of the one surface, a circular recess part corresponding to the device region and an annular projection part that surrounds outside of the circular recess part and corresponds to the outer circumferential surplus region, and,
in the laser beam irradiation step, a part corresponding to the outer circumferential surplus region in a thickness direction of the workpiece is subjected to ablation to be removed by irradiating the outer circumferential surplus region that is from the outer circumferential edge to the position separate inward from the outer circumferential edge by the predetermined distance with the laser beam.

6. The processing method of a workpiece according to claim 1, wherein,
in the laser beam irradiation step, the other surface is irradiated with the laser beam in a state in which a plane of incidence of the laser beam is set orthogonal to a virtual plane that passes through a center of the other surface and a focal point of the laser beam and is orthogonal to the other surface.

7. The processing method of a workpiece according to claim 6, wherein
a processing groove orthogonal to the other surface is formed by rotating the holding unit with respect to the focal point of the laser beam in the laser beam irradiation step.

8. The processing method of a workpiece according to claim 1, wherein,
in the laser beam irradiation step, irradiation with the laser beam that travels obliquely with respect to the other surface from a side of a center of the other surface toward outside of the other surface is executed in a state in which a plane of incidence of the laser beam is set parallel to a virtual plane that passes through the center of the other surface and a focal point of the laser beam and is orthogonal to the other surface.

9. The processing method of a workpiece according to claim 8, wherein
in the laser beam irradiation step, the irradiation with the laser beam is executed in the state in which the plane of incidence of the laser beam is set parallel to the virtual plane by controlling an irradiation position of the laser beam by a galvanometer scanner disposed to face the other surface.

10. The processing method of a workpiece according to claim 1, wherein
the laser beam irradiation step forms a processing groove in the workpiece by the laser beam and includes a detection step of detecting the laser beam that has passed through the processing groove by a light detection unit when the processing groove has penetrated the workpiece.

* * * * *